US011975536B2

(12) United States Patent
Negishi et al.

(10) Patent No.: US 11,975,536 B2
(45) Date of Patent: May 7, 2024

(54) ELEMENT SUBSTRATE, LIQUID DISCHARGE HEAD, AND LIQUID DISCHARGE APPARATUS

(71) Applicant: CANON KABUSHIKI KAISHA, Tokyo (JP)

(72) Inventors: Toshio Negishi, Kanagawa (JP); Yasuhiro Soeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 17/670,325

(22) Filed: Feb. 11, 2022

(65) Prior Publication Data
US 2022/0266590 A1    Aug. 25, 2022

(30) Foreign Application Priority Data

Feb. 22, 2021    (JP) .................................. 2021-026638

(51) Int. Cl.
*B41J 2/045*    (2006.01)
*G11C 17/16*    (2006.01)
*G11C 17/18*    (2006.01)

(52) U.S. Cl.
CPC .......... *B41J 2/04541* (2013.01); *G11C 17/16* (2013.01); *G11C 17/18* (2013.01); *B41J 2/0458* (2013.01)

(58) Field of Classification Search
CPC ...................................................... B41J 2/045
See application file for complete search history.

(56) References Cited

U.S. PATENT DOCUMENTS

| 5,668,751 | A * | 9/1997 | Sher ................ G11C 17/18 365/96 |
| 7,983,105 | B2 | 7/2011 | Ogishima |
| 9,144,978 | B2 | 9/2015 | Ohmura |
| 9,592,667 | B2 | 3/2017 | Ohmura |
| 10,226,921 | B2 | 3/2019 | Ohmura |
| 10,894,403 | B2 | 1/2021 | Fujii et al. |
| 2007/0053236 | A1* | 3/2007 | Vogelsang ....... G11C 29/50008 365/96 |
| 2008/0298145 | A1 | 12/2008 | Ogishima |
| 2010/0103750 | A1 | 4/2010 | Ohmura |
| 2014/0078223 | A1* | 3/2014 | Ohmura ................ G11C 17/16 347/56 |

(Continued)

FOREIGN PATENT DOCUMENTS

| JP | H08-263994 A | 10/1996 |
| JP | 2008299989 A | 12/2008 |
| JP | 2014058130 A | 4/2014 |

Primary Examiner — Shelby L Fidler
(74) Attorney, Agent, or Firm — Canon U.S.A., Inc. IP Division

(57) ABSTRACT

An element substrate including a liquid discharge element, comprising a memory element capable of storing individual information of the element substrate by a write, the memory element being configured to change an impedance value by the write, a plurality of current supply elements capable of supplying a current to the memory element, and a determination unit configured to determine presence/absence of the write based on a voltage generated in the memory element by the current selectively supplied from the plurality of current supply elements, wherein the plurality of current supply elements constitute a part of a current mirror circuit and each supply the current in an amount according to a size ratio to the memory element.

13 Claims, 7 Drawing Sheets

(56) References Cited

U.S. PATENT DOCUMENTS

| | | |
|---|---|---|
| 2015/0298457 A1 | 10/2015 | Ohmura |
| 2017/0136765 A1 | 5/2017 | Ohmura |
| 2018/0050901 A1* | 2/2018 | Neo ................. B05B 17/06 |
| 2018/0061826 A1* | 3/2018 | Fujii ............... H01L 27/0629 |
| 2018/0236761 A1* | 8/2018 | Taniguchi .......... B41J 2/0458 |
| 2018/0281390 A1* | 10/2018 | Fujii ............... B41J 2/04511 |
| 2020/0189265 A1* | 6/2020 | Gardner ........... B41J 2/0458 |

* cited by examiner

ELEMENT SUBSTRATE, LIQUID DISCHARGE HEAD, AND LIQUID DISCHARGE APPARATUS

BACKGROUND

Field of the Disclosure

The present disclosure mainly relates to an element substrate.

Description of the Related Art

A liquid discharge head used in, for example, a printer using an inkjet printing method includes an element substrate on which a plurality of liquid discharge elements are arrayed (see Japanese Patent Laid-Open No. 2014-58130). The element substrate is provided with memory elements that store whether to permit driving of the individual liquid discharge elements. According to this configuration, whether to permit driving of each of the liquid discharge elements is decided based on the presence/absence of a write to a corresponding memory element. For example, if a liquid discharge element cannot be driven, another liquid discharge element can be driven to complement that. As the memory element, a so-called one time programmable memory that is a memory element configured to permit a write only once, for example, an anti-fuse element can be used. Depending on the presence/absence of a write to a memory element, the impedance value (mainly, the electric resistance value) of the memory element changes.

In Japanese Patent Laid-Open No. 2008-299989, a configuration capable of determining the presence/absence of a write to a memory element by detecting a voltage generated by supplying a current to the memory element is described. However, according to this configuration, for example, if the amount of the current supplied to the memory element varies due to a peripheral environment such as a temperature, the impedance value of the memory element may vary. There is room for improvement from the viewpoint of increasing the accuracy of the determination.

SUMMARY

It is an exemplary object of some embodiments to provide a technique advantageous in increasing the accuracy of determining the presence/absence of a write to a memory element.

One of the aspects of some embodiments provides an element substrate including a liquid discharge element, comprising a memory element capable of storing individual information of the element substrate by a write, the memory element being configured to change an impedance value by the write, a plurality of current supply elements capable of supplying a current to the memory element, and a determination unit configured to determine the presence/absence of the write based on a voltage generated in the memory element by the current selectively supplied from the plurality of current supply elements, wherein the plurality of current supply elements constitute a part of a current mirror circuit and each supply the current in an amount according to a size ratio to the memory element.

Further features of various embodiments will become apparent from the following description of exemplary embodiments (with reference to the attached drawings).

DESCRIPTION OF THE EMBODIMENTS

Figure 1:
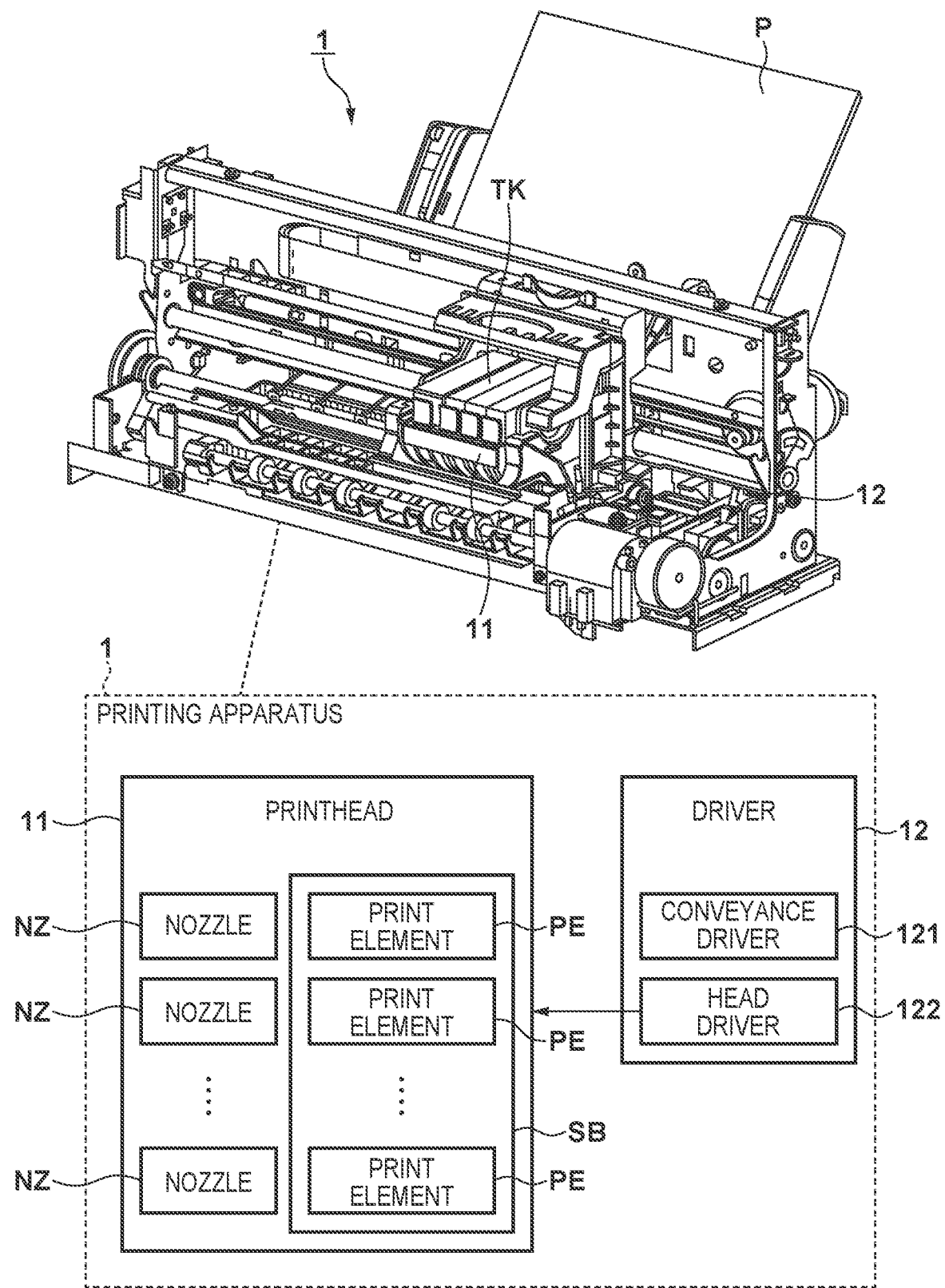
FIG. 1 is a view showing an example of the configuration of a printing apparatus (liquid discharge apparatus)

Hereinafter, embodiments will be described in detail with reference to the attached drawings. Note, the following embodiments are not intended to limit the scope of every embodiment. Multiple features are described in the embodiments, but limitation is not made to embodiments that require all such features, and multiple such features may be combined as appropriate. Furthermore, in the attached drawings, the same reference numerals are given to the same or similar configurations, and redundant description thereof is omitted.

In this specification, embodiments will be described by exemplifying a printing apparatus using an inkjet printing method. However, the printing method is not limited to this. Also, the printing apparatus may be a single function printer having only a printing function or may be a multi-function printer having a plurality of functions, such as a printing function, a FAX function, and a scanner function. In addition, the printing apparatus may be a manufacturing device configured to manufacture, for example, a color filter, an electronic device, an optical device, a microstructure, or the like using a predetermined printing method.

Also, "print" in this specification should be interpreted in a broader sense. Hence, the mode of "print" is irrespective of whether or not the target to be formed on a print medium is significant information, such as a character or graphic pattern, and is also irrespective of whether the target is manifested in a way that can be perceived visually by humans.

"Print media" should also be interpreted in a broader sense, like "print". Hence, the concept of "print media" includes sheet-shaped members used in general, and any material capable of receiving ink, including paper, fabrics, plastic films, metals, glass, ceramics, resins, wood, and leathers can be used.

"Ink" should also be interpreted in a broader sense, like "print". Hence, the concept of "ink" can include not only a liquid that is applied to a print medium to form an image, a design, a pattern, or the like but also an incidental liquid that can be provided to process a print medium or process ink (for example, coagulate or insolubilize color materials in ink applied to a print medium). Hence, in this specification, this can be expressed "liquid" in place of "ink".

In these viewpoints, a printing apparatus may be referred to as a liquid discharge apparatus, a discharge apparatus, or the like. To the same effect, a printhead provided in the printing apparatus may be referred to as a liquid discharge head, a discharge head, or the like. Similarly, a print element substrate provided in the printhead may be referred to as a liquid discharge element substrate or a discharge element substrate, or simply as an element substrate. In addition, each of a plurality of print elements arrayed on the print element substrate may be referred to as a liquid discharge element, a discharge element, or the like.

First Embodiment

FIG. 1 shows an example of the configuration of a printing apparatus 1 according to the first embodiment. The printing apparatus 1 includes a printhead 11 and a driver 12 and, in this embodiment, performs printing by an inkjet printing method. The printhead 11 is configured to execute printing on a predetermined print medium P, and includes a plurality of nozzles NZ and a print element substrate SB. Each nozzle NZ is a liquid discharge port that discharges a liquid received from a liquid tank TK that stores the liquid. The plurality of nozzles NZ are arrayed on a surface on a side to execute printing.

The print element substrate SB includes a plurality of print elements PE corresponding to the plurality of nozzles NZ. When each print element PE is driven, a liquid is discharged from the corresponding nozzle NZ, thereby executing printing. In this embodiment, a resistive element (or simply called a heater) that is an electrothermal transducer is used as the print element PE. As another embodiment, a piezoelectric element may be used.

The driver 12 includes a conveyance driver 121 and a head driver 122. The conveyance driver 121 conveys the print medium P set in the main body of the printing apparatus 1 to the printhead 11. The head driver 122 drives the printhead 11 with respect to the conveyed print medium P to cause the individual nozzles NZ to discharge the liquid, thereby performing printing.

Note that in this embodiment, the printhead 11 is a serial head that performs printing on the print medium P while scanning in a direction crossing the conveyance direction of the print medium P. As another embodiment, the printhead 11 may be a line head capable of printing at once on the whole region of the print medium P in the widthwise direction.

Figure 2:
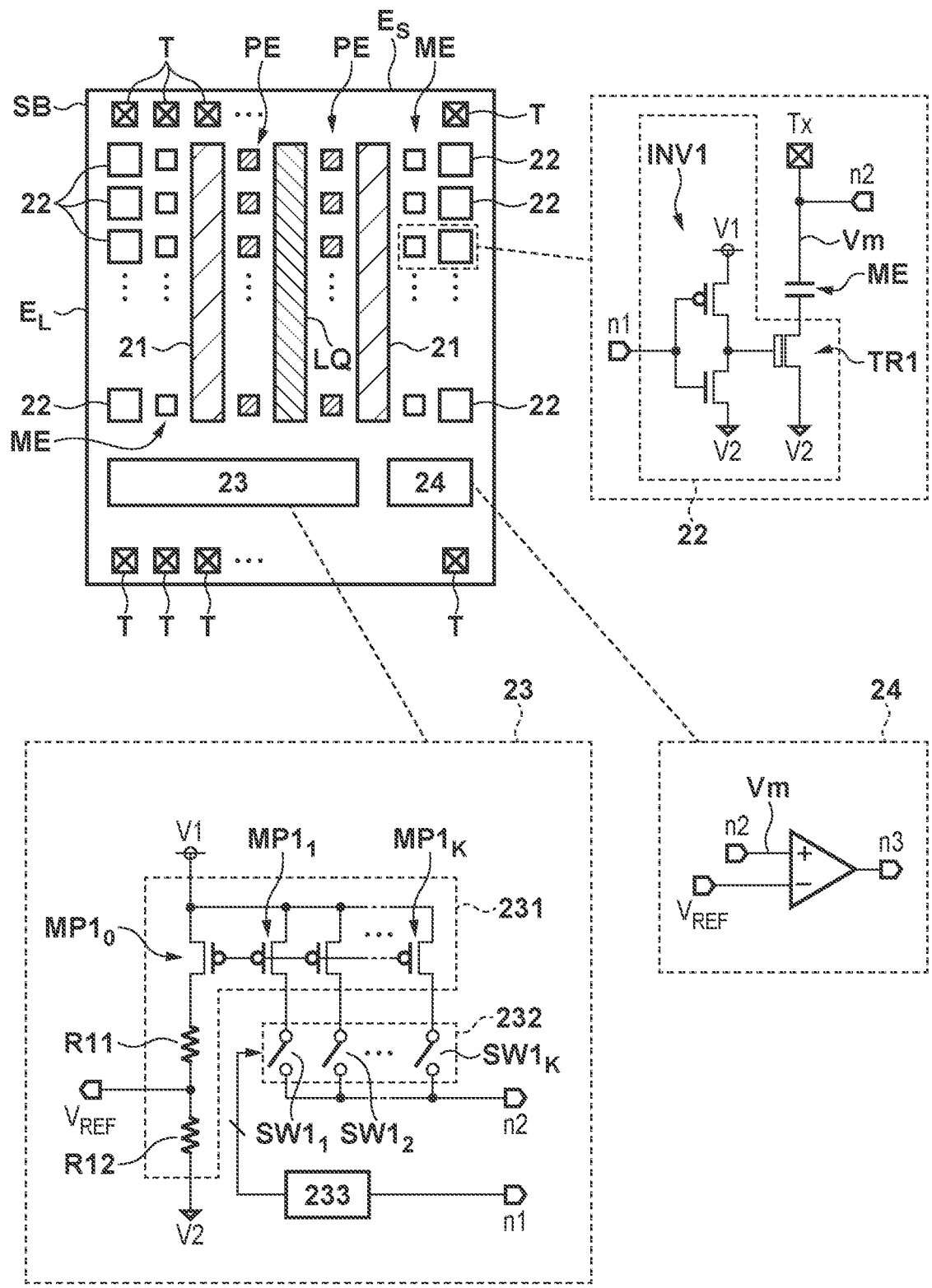
FIG. 2 is a view showing an example of the configuration of a print element substrate (element substrate)

FIG. 2 shows an example of the configuration of the print element substrate SB. In a planar view (a viewpoint in a direction vertical to the principal plane, a top view), the print element substrate SB has an outer shape including a long side (first side) $E_L$ and a short side (second side) $E_S$. In this embodiment, the print element substrate SB has a rectangular shape. As another embodiment, the print element substrate SB may have a square shape, a parallelogram shape, or a trapezoidal shape. In addition to the above-described plurality of print elements PE, the print element substrate SB includes driving units 21, a plurality of memory elements ME, a plurality of write units 22, a current supply unit 23, and a determination unit 24.

In this embodiment, a channel LQ for a liquid is extended in a longitudinal direction (a direction parallel to the long side $E_L$) in a planar view, and the plurality of print elements PE are arrayed in the longitudinal direction on both sides of the channel LQ. The driving unit 21 is arranged, on each side of the channel LQ, between the long side $E_L$ and the plurality of print elements PE, and can individually drive the plurality of print elements PE. The liquid is supplied from the liquid tank TK to above the print element PE via the channel LQ, and after that, foamed and discharged when the driving units 21 drive the print elements PE.

Here, the driving units 21 can drive the plurality of print elements PE by a time division method. That is, the plurality of print elements PE are divided into a plurality of groups, and the driving units 21 sequentially drive each of two or more print elements PE of each group as a block. For example, if the number of groups is i, and each group includes j print elements PE as blocks, first, the driving units 21 drive a first block (i print elements PE) for each of the first to ith groups. Next, the driving units 21 drive a second block (i print elements PE) for each of the first to ith groups. According to the same procedure, the driving units 21 sequentially drive a third, fourth, . . . , jth blocks (i print elements PE in each block) for each of the first to ith groups.

To implement driving of the plurality of print elements PE by the time division method, the driving unit 21 can typically include a decoder, a shift register, a latch circuit, a selector, an AND circuit, an OR circuit, and the like. Note that each of i and j is an integer of 2 or more. Also, the group can also be called a time division group, and the block can also be called a time division block.

To correspond to the above-described plurality of print elements PE, the plurality of memory elements ME are arrayed in the longitudinal direction, and the plurality of write units 22 are similarly arrayed in the longitudinal direction. Also, the current supply unit 23 and the determination unit 24 are juxtaposed in the widthwise direction (a direction parallel to the short side $E_S$).

In addition, at edge portions near the short sides $E_S$ of the print element substrate SB, a plurality of terminals T are arrayed in the widthwise direction. Supply of a power supply voltage to the print element substrate SB and signal transmission/reception of the print element substrate SB are performed via the plurality of terminals T. A power supply voltage V1 shown in FIG. 2 is 3.3 [V (volt)], and a power supply voltage V2 is 0 [V] (the voltage V2 can also be referred to as a ground voltage). Note that a voltage described in this specification represents a potential difference from the ground voltage V2.

To facilitate understanding, FIG. 2 shows two types of voltages, that is, the voltages V1 and V2. However, another power supply voltage different from the voltage V1 and/or V2 may further be supplied to the print element substrate SB. This/these other voltages may be supplied to some of the circuit portions shown in FIG. 2 in place of the voltage V1 and/or V2.

The memory elements ME can store the individual information of the print element substrate SB, such as correction information for individual variations of the print element substrate SB, the number of printed sheets, the remaining ink amount, and whether to permit driving of the print elements PE. As the memory element ME, a so-called OTP memory (one time programmable memory) that permits write only once is used. In this embodiment, an anti-fuse element is used. Here, an anti-fuse element having a MOS (Metal Oxide Semiconductor) structure is used as the memory element ME.

Each write unit 22 is configured to implement one or more writes to the memory element ME, and includes a high breakdown voltage transistor TR1 and a control inverter circuit INV1. The high breakdown voltage transistor TR1 is connected in serial with the memory element ME. As will be described later in detail, when brought into a conductive state, the high breakdown voltage transistor TR1 functions as a write transistor in a write to the memory element ME, and also functions as a read transistor when confirming the presence/absence of a write to the memory element ME. As the high breakdown voltage transistor TR1, a DMOS (Double Diffused MOS) transistor is used.

The control inverter circuit INV1 is connected to the gate terminal of the high breakdown voltage transistor TR1, and controls the high breakdown voltage transistor TR1 based on a control signal received via a node n1 (set the high breakdown voltage transistor TR1 in a conductive state or a non-conductive state).

Write to the memory element ME is done by applying a relatively high voltage (for example, 32 [V]) to the memory element ME via a write terminal Tx that is one of the plurality of terminals T during the conductive state of the high breakdown voltage transistor TR1 to cause dielectric breakdown of the MOS structure of the memory element ME. For this reason, the impedance value of the memory element ME can be changed by the write. In this embodiment, before a write, the memory element ME is an insulated state, and exhibits a very large electric resistance value (or a high impedance of, for example, several [MΩ (megaohm)]). After a write, the memory element ME is in a conductive state, and exhibits a relatively small electric resistance value (for example, several to several tens [kΩ (kiloohm)]. At the time of a write, the high voltage is applied to the terminal Tx. Otherwise, the terminal Tx is in an open state.

Note that as another embodiment, a fuse element may be used as the memory element ME. In this case, before a write, the memory element ME is in a short-circuited state, and exhibits a relatively small electric resistance value. After a write, the memory element ME is in an open state, and exhibits a very large electric resistance value.

The current supply unit 23 includes a current generation unit 231, a selection unit 232, and a current supply controller 233. The current generation unit 231 includes a plurality of transistors $MP1_0$ to $MP1_K$, and resistive elements R11 and R12. In this embodiment, p-channel MOS transistors are used as the transistors $MP1_0$ to $MP1_K$. Note that K is an integer of 2 or more.

The transistors $MP1_1$ to $MP1_K$ constitute a current mirror circuit with the transistor $MP1_0$. For example, if the transistors $MP1_0$ to $MP1_K$ have the same channel length and channel widths different from each other, letting m be an arbitrary one of integers 1 to K, a current according to the channel width ratio to the transistor $MP1_0$ flows to a transistor $MP1_m$. Hence, each of the transistors $MP1_1$ to $MP1_K$ can output a current in an amount according to the size ratio.

In this embodiment, the resistive elements R11 and R12 are connected in series with the transistor $MP1_0$, and the voltage between the resistive elements R11 and R12 is used as a reference voltage $V_{REF}$. Here, the resistive elements R11 and R12 are provided such that the reference voltage $V_{REF}=1$ [V] is obtained under the power supply voltage V1=3.3 [V].

The selection unit 232 includes switch elements $SW1_1$ to $SW1_K$ corresponding to the transistors $MP1_1$ to $MP1_K$, and can selectively connect the transistors $MP1_1$ to $MP1_K$ to the memory element ME. For example, letting m be an arbitrary one of integers 1 to K, if a switch element $SW1_m$ is set in a conductive state, the transistor $MP1_m$ is connected to the memory element ME, and a current according to the size ratio is supplied to the memory element ME. From this viewpoint, it can be said that each of the transistors $MP1_1$ to $MP1_K$ functions as a current supply element capable of supplying a current to the memory element ME.

The current supply controller 233 can individually control the switch elements $SW1_1$ to $SW1_K$ of the selection unit 232, thereby selectively setting the switch elements $SW1_1$ to $SW1_K$ in a conductive state. To facilitate understanding, in this embodiment, assume that one of the switch elements $SW1_1$ to $SW1_K$ is set in the conductive state by the current supply controller 233, that is, one of the transistors $MP1_1$ to $MP1_K$ can selectively be connected to the memory element ME. As another embodiment, two or more of the switch elements $SW1_1$ to $SW1_K$ may be set in the conductive state, that is, currents of two or more of the transistors $MP1_1$ to $MP1_K$ may be superimposed and supplied to the memory element ME. Hence, the current supply controller 233 need only be able to connect at least some of the transistors $MP1_1$ to $MP1_K$ to the memory element ME by the selection unit 232.

Summarizing the current supply unit 23, the current supply controller 233 outputs a control signal to the control inverter circuit INV1 via the node n1, thereby setting the high breakdown voltage transistor TR1 in the conductive state. During this, the current supply controller 233 controls the selection unit 232, thereby supplying a desired amount of current from the current generation unit 231 to the memory element ME via a node n2.

The determination unit 24 is configured to determine the presence/absence of a write to the memory element ME (that is, whether to permit driving of the print element PE). In this embodiment, the determination unit 24 is a comparator than compares a voltage (the voltage of the node n2) Vm generated in the memory element ME with the reference voltage $V_{REF}$. Determination of the determination unit 24 is performed by supplying a current from the current supply unit 23 (one of the transistors $MP1_1$ to $MP1_K$) to the memory element ME during the time when the control inverter circuit INV1 sets the high breakdown voltage transistor TR1 in the conductive state. In general, if the memory element ME is in a written state, the voltage Vm is lower than that in the state before the write to the memory element ME. Based on the magnitude relationship between the voltage Vm and the reference voltage $V_{REF}$, the result of the determination of the determination unit 24 is output from a node n3 to the circuit portion of the subsequent stage, or output from the terminal T of the print element substrate SB to the outside via the node n3.

In this way, the determination unit 24 can determine the presence/absence of a write to the memory element ME based on the voltage Vm generated in the memory element ME by the current supplied from the current supply unit 23. If the memory element ME is in a written state, the driving unit 21 considers that, for example, the corresponding print element PE cannot be driven, and suppresses driving of the corresponding print element PE. To complement this, the driving unit 21 may alternatively drive another print element PE capable of recording almost the same position as the corresponding print element PE.

As will be described later in detail, the determination by the determination unit 24 is performed to determine the presence/absence of a write to the memory element ME, and can also be performed for another purpose, usage, or function.

As described above, the impedance value of the memory element ME can be changed by a write. However, the impedance value may change depending on the conditions of the print element substrate SB. It is considered that the impedance value varies due to, for example, a peripheral environment, such as a temperature, a manufacturing variation, a mode of dielectric breakdown of a MOS structure, and other factors. When the variations of the power supply voltage V1 and the like are also taken into consideration, it is also considered that the amounts of currents output from the transistors $MP1_0$ to $MP1_K$ vary, and accordingly, the reference voltage $V_{REF}$ and the voltage Vm vary.

For this reason, for example, (a) in a case in which in an evaluation step upon manufacturing the print element substrate SB, it is confirmed whether the MOS structure of the memory element ME is appropriately formed/it is confirmed whether the memory element ME is in a state before a write (to be referred to as "manufacturing confirmation of the memory element ME" for the sake of discrimination), (b) in a case in which at another timing different from (a), it is specified not to permit driving of the print element PE, a write to the corresponding memory element ME is performed, and after that, it is confirmed whether the write is appropriately implemented/it is confirmed whether the memory element ME is in a written state (to be referred to as "confirmation of write completion in the memory element ME" for the sake of discrimination), and (c) in a case in which at another timing different from (a) and (b), the presence/absence of a write to the memory element ME is performed (to be referred to as "read from the memory element ME" for the sake of discrimination), the conditions may be different from each other. As an example, when performing a write to the memory element ME, a relatively large amount of current is supplied to the memory element ME, and it is therefore considered that the temperature of the print element substrate SB becomes high.

Hence, in the determination of the determination unit 24, it is necessary to provide a margin that changes depending on several purposes, usages, or functions, and a current in an amount corresponding to these is preferably supplied to the memory element ME.

As described above, the memory element ME that is an anti-fuse element in this embodiment is in an insulated state and exhibits a very large electric resistance value before write, and is in a conductive state and exhibits a relatively small electric resistance value after write.

Considering this, the determination unit 24, for example:

preferably determines, in the case (a), whether the electric resistance value of the memory element ME is larger than $R_{1M}$, preferably determines, in the case (b), whether the electric resistance value of the memory element ME is smaller than $R_{1K}$ ($R_{1K} < R_{1M}$), and preferably determines, in the case (c), whether the electric resistance value of the memory element ME is larger (or smaller) than $R_{2K}$ ($R_{2K} > R_{1K}$, $R_{2K} < R_{1M}$).

The above-described matters occur because it is necessary to:

reliably confirm that the memory element ME is in the state before a write in the case (a), reliably confirm that the memory element ME is in the written state in the case (b), and prevent a determination error concerning the presence/absence of a write to the memory element ME in the case (c).

Note that as typical examples of parameters, the electric resistance value $R_{1M}$ is 100 [kΩ], the electric resistance value $R_{1K}$ is 5 [kΩ], and the electric resistance value $R_{2K}$ is 50 [kΩ]. However, the parameters are not limited to these values.

Figure 3:
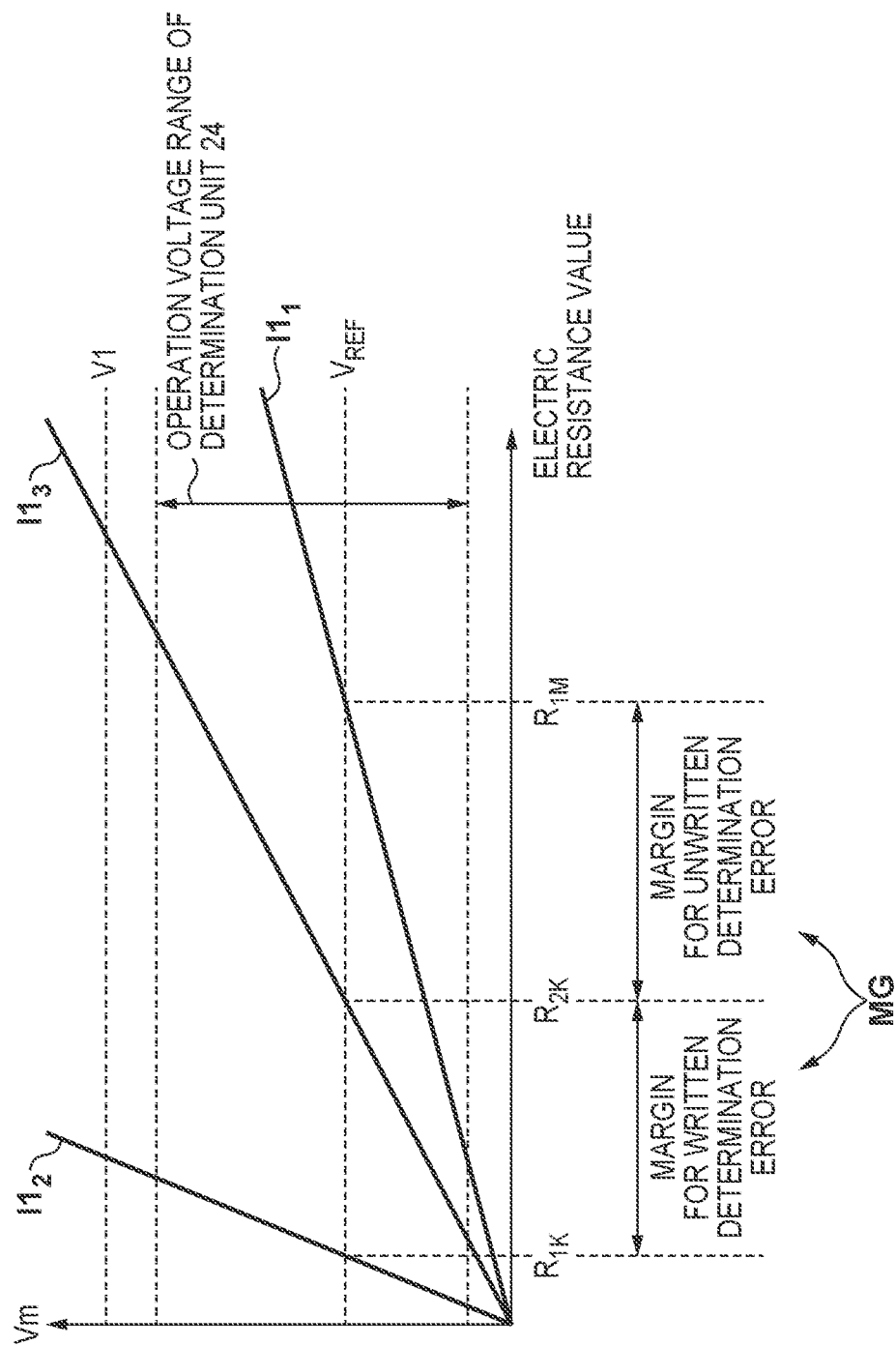
FIG. 3 is a view for explaining an example of a method of determining the presence/absence of a write to a memory element.

FIG. 3 shows the voltage Vm in a case in which K=3 (a case in which a current is supplied from one of transistors $MP1_1$ to $MP1_3$ to the memory element ME). The abscissa represents the electric resistance value of the memory element ME. The ordinate represents the voltage Vm generated in the memory element ME in correspondence with current amounts $I1_1$, $I1_2$, and $I1_3$ output from the transistors $MP1_1$, $MP1_2$, and $MP1_3$, respectively ($I1_1 < I1_3 < I1_2$).

Note that when reference voltage $V_{REF}=1$ [V] is set, as typical examples of parameters, the current amount $I1_1$ is 10 [μA (microampere)], the current amount $I1_2$ is 200 [μA], and the current amount $I1_3$ is 20 [μA]. However, the parameters are not limited to these values.

According to this embodiment, as is apparent from FIG. 3, the determination unit 24 can supply the current amount $I1_1$ from the transistor $MP1_1$ to the memory element ME and perform manufacturing confirmation of the memory element ME in the case (a), can supply the current amount $I1_2$ from the transistor $MP1_2$ to the memory element ME and perform confirmation of a write completion in the memory element ME in the case (b), and can supply the current amount $I1_3$ from the transistor $MP1_3$ to the memory element ME and perform a read from the memory element ME in the case (c).

According to this configuration, in the case (c), a margin MG for determination is provided with respect to the cases (a) and (b). As compared to a case of K=1, it is possible to appropriately prevent a determination error. The margin MG includes a margin for a determination error in both the written state and the state before write. In this embodiment, a case of K=3 has been exemplified. As another embodiment, K=2 is possible, and K≥4 is also possible. The integer K can be changed in accordance with the purpose, usage, or function.

Figure 4:
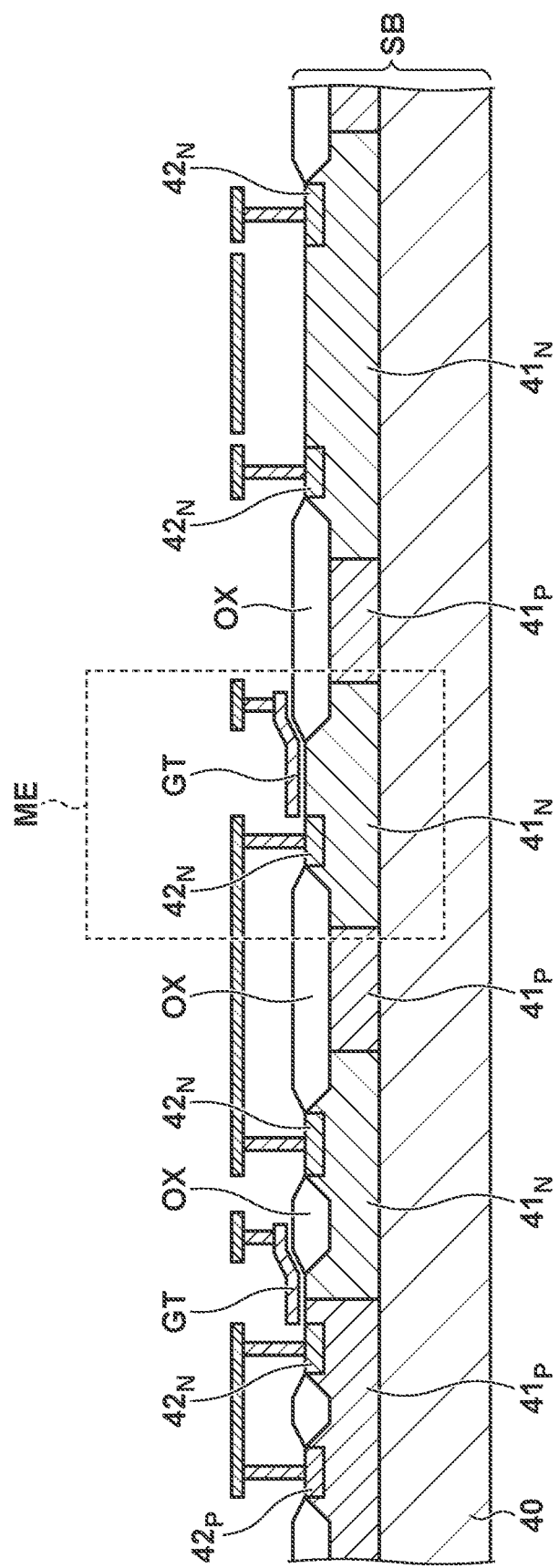
FIG. 4 is a sectional schematic view showing a part of the structure of the print element substrate.

FIG. 4 is a sectional schematic view of a region including the memory element ME and the high breakdown voltage transistor TR1 on the print element substrate SB. For example, a plurality of p-type wells $41_P$ and a plurality of n-type wells $41_N$, and p-type regions $42_P$ and/or n-type regions $42_N$ in the wells $41_P$ or $41_N$ are provided in a p-type semiconductor substrate 40. Between several regions $42_P$ or $42_N$, LOCOS (Local Oxidation of Silicon) films are provided as thick insulating members OX. A gate electrode GT is provided such that a part thereof covers the insulating member OX. With this structure, a MOS structure serving as an anti-fuse element is formed as the memory element ME, and an n-channel DMOS transistor is formed as the high breakdown voltage transistor TR1.

Typically, silicon can be used for the above-described semiconductor substrate 40, silicon oxide can be used for the insulating member OX, and polysilicon can be used for the gate electrode GT. The net p-type impurity concentration in the semiconductor substrate 40 is, for example, about $1 \times 10^{16}$ [cm$^{-3}$]. The net p-type impurity concentration in the p-type well $41_P$ is, for example, about $1 \times 10^{18}$ [cm$^{-3}$]. The net n-type impurity concentration in the n-type well $41_N$ is, for example, about $1 \times 10^{18}$ [cm$^{-3}$]. The net p-type impurity concentration in the p-type region $42_P$ is, for example, about $1 \times 10^{19}$ [cm$^{-3}$]. The net n-type impurity concentration in the n-type region $42_N$ is, for example, about $1 \times 10^{19}$ [cm$^{-3}$]. Note that the net impurity concentrations are not limited to these examples.

As described above, according to this embodiment, the memory element ME is configured to store, by a write, whether to permit driving of the print element PE and change the impedance value by the write. The transistors $MP1_1$ to $MP1_K$ constitute a part of a current mirror circuit, and each transistor supplies a current in an amount according to the size ratio to the memory element ME. The transistors $MP1_1$ to $MP1_K$ are provided in accordance with the purpose, usage, or function. In this embodiment, the current is selectively supplied from one of the transistors $MP1_1$ to $MP1_K$ to the memory element ME. The determination unit 24 determines the presence/absence of a write to the memory element ME based on the voltage Vm generated in the memory element ME at that time. According to this configuration, it is possible to increase the accuracy of the determination of the determination unit 24 independently of the variation of the impedance value of the memory element ME caused by a factor, such as the peripheral environment or manufacturing variation, or the variations of the power supply voltage V1 and the like.

Here, the single channel LQ has been exemplified, and a configuration in which the plurality of print elements PE, the driving units 21, the plurality of memory elements ME, and the plurality of write units 22 are arranged on both sides of the channel LQ has been described. The number of channels LQ may be two or more. In this case, the plurality of print elements PE, the driving units 21, the plurality of memory elements ME, and the plurality of write units 22 are preferably arranged on both sides of each channel LQ.

The two or more channels LQ are assumed to be juxtaposed in the widthwise direction. However, these may additionally/alternatively be juxtaposed in the longitudinal direction. Note that in accordance with the number of channels LQ juxtaposed in the widthwise direction, the relationship between the long sides $E_L$ and the short sides $E_S$ in the outer shape of the print element substrate SB may be reversed.

Modification of First Embodiment

As described above, since the plurality of print elements PE are driven by the time division method, the plurality of memory elements ME and the plurality of write units 22 may be managed on a group basis.

Figure 5:
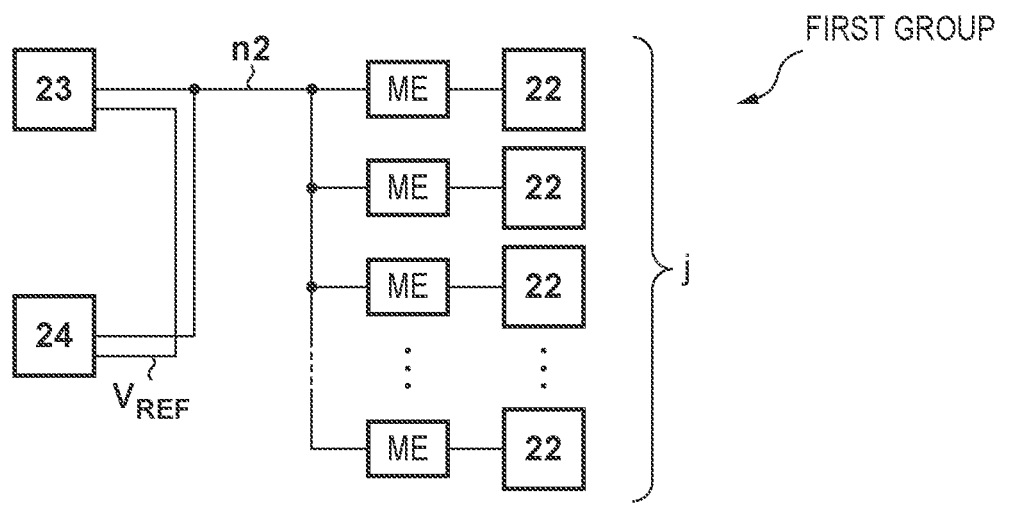
FIG. 5 is a view showing another example of the configuration of the print element substrate.
Figure 5:
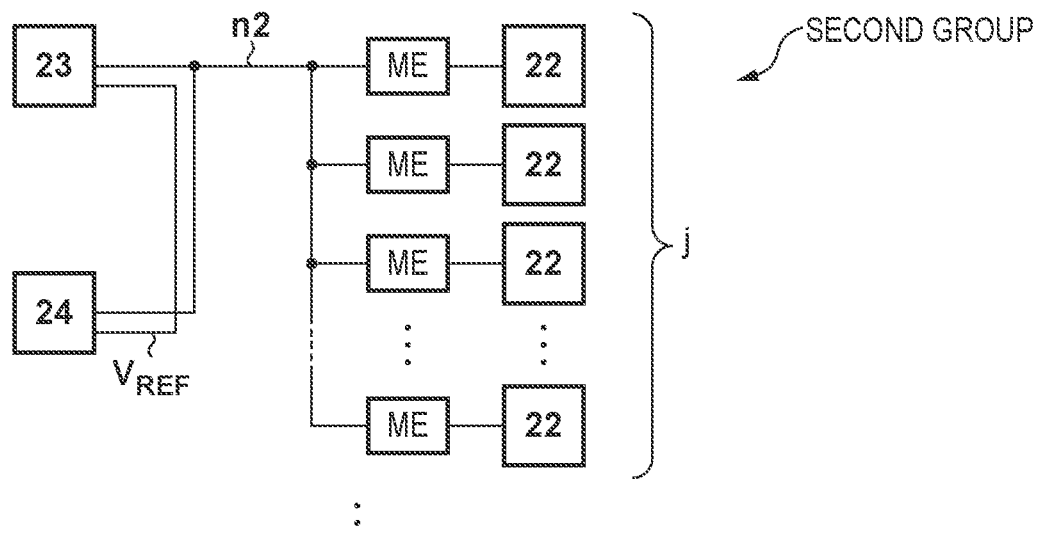
Figure 5:
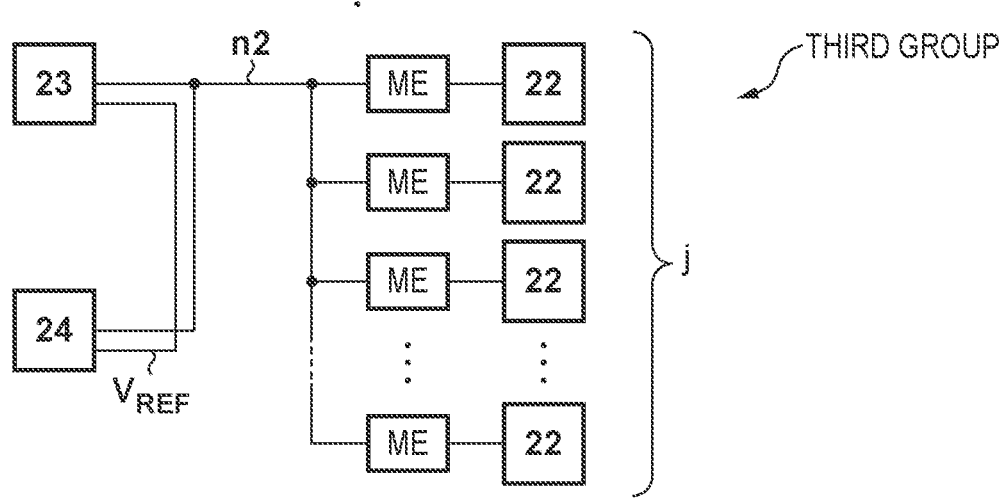

FIG. 5 shows an example of the configuration of a print element substrate SB' according to an example of this embodiment. According to the print element substrate SB', the plurality of memory elements ME and the plurality of write units 22 are divided into i groups, like the plurality of print elements PE. That is, j memory elements ME and j write units 22 are arranged in each of the first to ith groups. One current supply unit 23 can be provided for each group, and one determination unit 24 can be provided for each group.

The i current supply units 23 and the i determination units 24, which are provided in this way, are preferably arrayed in the widthwise direction. The result of each determination unit 24 is obtained as a bit signal for each group. For this reason, i bit signals are obtained in total, and these can be read out as bit data using, for example, i flip-flop circuits connected in series.

According to this configuration, it is advantageous in speeding up the determination of the presence/absence of a write to the memory element ME by the determination unit 24. Also, since the influence of a manufacturing variation can further be reduced, it is also advantageous in further speeding up the determination of the determination unit 24.

Second Embodiment

In the above-described first embodiment, a configuration in which the current supply unit 23 and the determination unit 24 are juxtaposed in the widthwise direction on one of the two short sides $E_S$ has been exemplified. However, these may be installed on both of the two short sides $E_S$.

Figure 6:
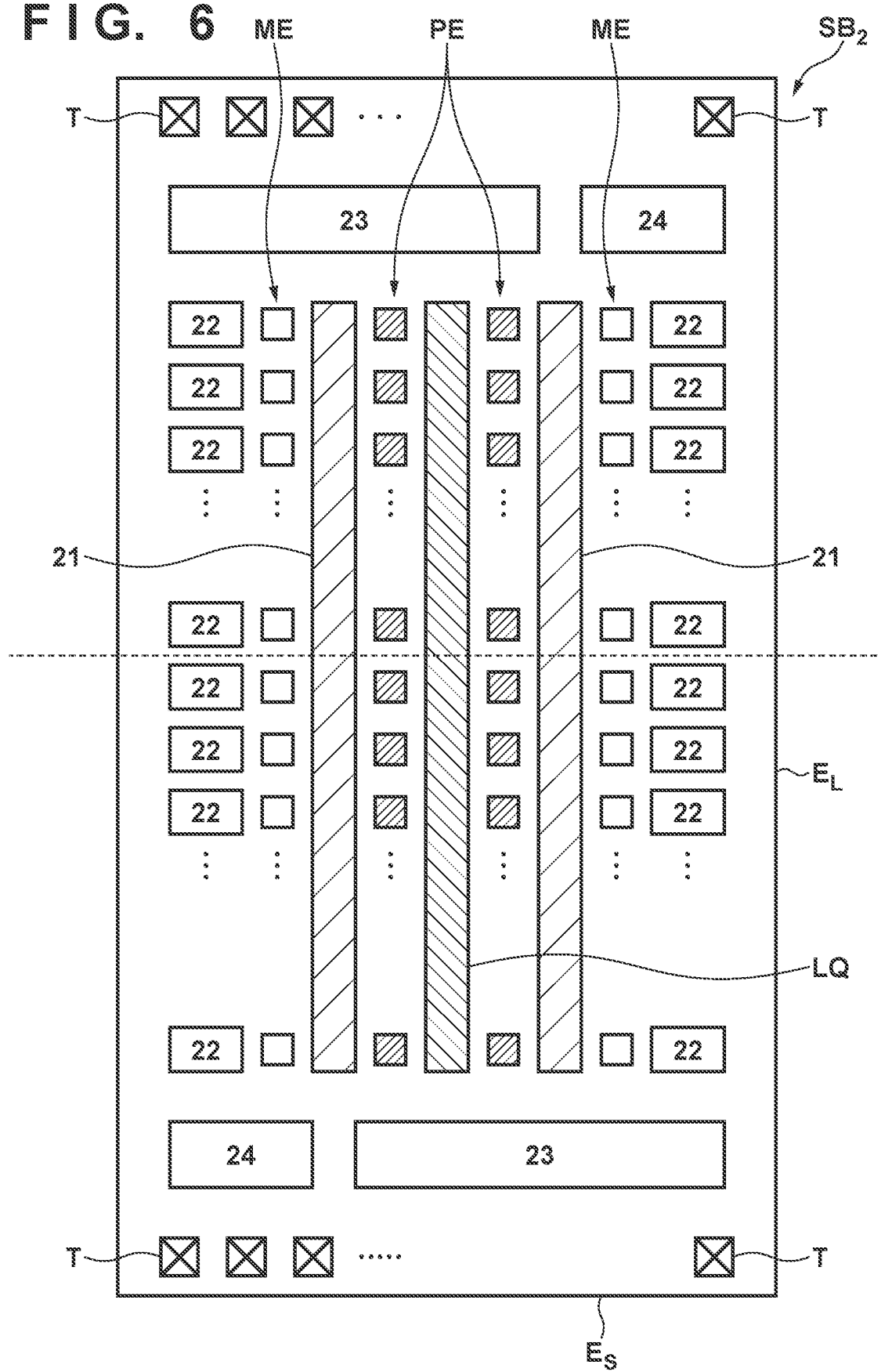
FIG. 6 is a view showing still another example of the configuration of the print element substrate.

FIG. 6 shows an example of the configuration of a print element substrate $SB_2$ according to the second embodiment. According to this embodiment, a current supply unit 23 and a determination unit 24 are juxtaposed in the widthwise direction on each of one side and the other side (the upper side and the lower side in FIG. 6) of short sides $E_S$. To cope with this configuration, a plurality of print elements PE, a plurality of memory elements ME, and a plurality of write units 22 are divided into the one side and the other side of the short sides $E_S$. Note that this division is indicated by a broken line in FIG. 6.

To the memory elements ME on one side of the short sides $E_S$, the current supply unit 23 on the one side supplies a current. Based on a voltage Vm generated by this, the determination unit 24 on the one side determines the presence/absence of a write to the memory elements ME. Similarly, to the memory elements ME on the other side of the short sides $E_S$, the current supply unit 23 on the other side supplies a current. Based on the voltage Vm generated by this, the determination unit 24 on the other side determines the presence/absence of a write to the memory elements ME.

Note that in the pair of current supply units 23, of a current generation unit 231, a selection unit 232, and a current supply controller 233, the current supply controller 233 may be provided only on the one side.

According to this embodiment, since the influence of a manufacturing variation can further be reduced, it is more advantageous in further speeding up the determination of the determination unit 24.

Third Embodiment

According to the configuration of the above-described first embodiment (see FIG. 2), while the high breakdown voltage transistor TR1 is in the non-conductive state, the node between the high breakdown voltage transistor TR1 and the memory element ME is substantially in a floating state. Hence, if a high voltage is applied to the memory element ME via the write terminal $T_X$ during the time, an unexpected dielectric breakdown may occur in the MOS structure of the memory element ME.

Figure 7:
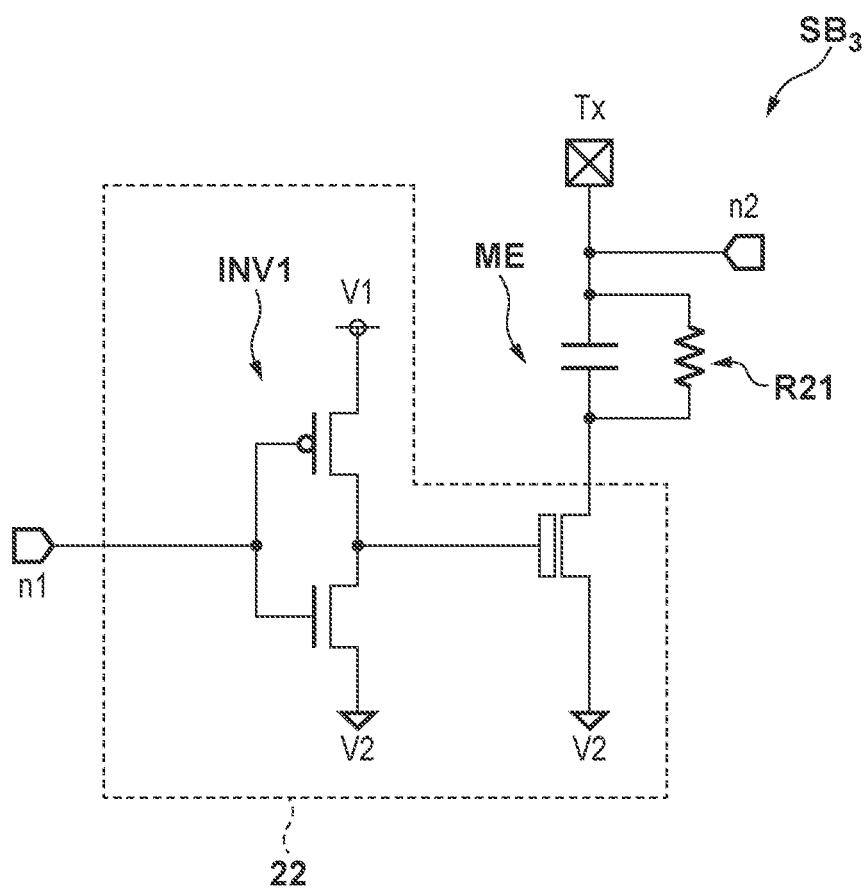
FIG. 7 is a view showing still another example of the configuration of the print element substrate.

FIG. 7 shows an example of the configuration of a print element substrate $SB_3$ according to the third embodiment. In this embodiment, the print element substrate $SB_3$ further includes a resistive element R21 connected in parallel with each memory element ME. According to this configuration, it is possible to prevent a write from being performed to the memory element ME in a case in which a high voltage is applied to the memory element ME via a write terminal $T_X$ during the non-conductive state of a high breakdown voltage transistor TR1.

That is, according to this embodiment, it is possible to prevent an erroneous write to the memory element ME. Hence, according to this embodiment, it is advantageous in improving the reliability of the print element substrate $SB_3$ as well.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2021-026638, which was filed on Feb. 22, 2021 and which is hereby incorporated by reference herein in its entirety.

What is claimed is:

1. An element substrate including a liquid discharge element, the substrate comprising:

a memory element capable of storing individual information of the element substrate by a write, the memory element being configured to change an impedance value by the write;

a plurality of current supply elements capable of supplying a current to the memory element;

a determination unit configured to determine presence/absence of the write based on a voltage generated in the memory element by the current selectively supplied from the plurality of current supply elements; and a controller, wherein the plurality of current supply elements include a first transistor and a plurality of second transistors so as to constitute at least a part of a current mirror circuit, the first transistor being connected in series to a first resistive element and a second resistive element to function as a current mirror source, and the plurality of second transistors being provided to function as a current mirror destination, wherein the controller selects at least one second transistor from the plurality of second transistors, and wherein the memory element is supplied with a current which is based on a ratio of a gate width of the selected second transistor with respect to a gate width of the first transistor.

2. The substrate according to claim 1, further comprising a plurality of switch elements connected in series to the plurality of second transistors, respectively, the plurality of switch elements being individually controlled by the controller such that the selected second transistor is connected to the memory element.

3. The substrate according to claim 1, wherein the determination unit is a comparator configured to compare the voltage generated in the memory element by the current supplied from the plurality of current supply elements with a reference voltage.

4. The substrate according to claim 1, further comprising a driving unit configured to drive the liquid discharge element, wherein the driving unit suppresses the driving of the liquid discharge element if the determination unit determines that the memory element is in a written state.

5. The substrate according to claim 1, wherein the memory element is an anti-fuse element.

6. The substrate according claim 1, further comprising a resistive element connected in parallel with the memory element.

7. The substrate according to claim 1, further comprising a write transistor configured to perform a write to the memory element.

8. The substrate according to claim 7, wherein the write transistor is a DMOS transistor.

9. The substrate according to claim 7, wherein the liquid discharge element is one of a plurality of liquid discharge elements, the memory element is one of a plurality of memory elements corresponding to the plurality of liquid discharge elements, the write transistor is one of a plurality of transistors corresponding to the plurality of memory elements, and the plurality of current supply elements supply the current to the memory element corresponding to, of the plurality of transistors, a transistor in a conductive state.

10. The substrate according to claim 9, wherein the element substrate has an outer shape including a first side and a second side in a planar view, the plurality of liquid discharge elements, the plurality of memory elements, and the plurality of transistors are arrayed in a direction parallel to the first side, and the determination unit and the current mirror circuit are juxtaposed in a direction parallel to the second side.

11. A liquid discharge head, comprising:

an element substrate defined in claim 1; and a liquid discharge port corresponding to a liquid discharge element.

12. A liquid discharge apparatus, comprising:

a liquid discharge head defined in claim 11; and a driver configured to drive the liquid discharge head.

13. The substrate according to claim 3, wherein a voltage between the first and second resistive elements is used as the reference voltage.

* * * * *